(12) United States Patent
Kajigaya

(10) Patent No.: US 7,701,794 B2
(45) Date of Patent: *Apr. 20, 2010

(54) SEMICONDUCTOR MEMORY DEVICE

(75) Inventor: Kazuhiko Kajigaya, Tokyo (JP)

(73) Assignee: Elipida Memory, Inc., Tokyo (JP)

( * ) Notice: Subject to any disclaimer, the term of this patent is extended or adjusted under 35 U.S.C. 154(b) by 22 days.

This patent is subject to a terminal disclaimer.

(21) Appl. No.: 12/127,198

(22) Filed: May 27, 2008

(65) Prior Publication Data

US 2008/0291764 A1 Nov. 27, 2008

(30) Foreign Application Priority Data

May 25, 2007 (JP) .............................. 2007-139735

(51) Int. Cl.
*G11C 7/02* (2006.01)
(52) U.S. Cl. ...................................... 365/207; 365/205
(58) Field of Classification Search ................. 365/207, 365/205, 189.04, 185.13, 189.05
See application file for complete search history.

(56) References Cited

U.S. PATENT DOCUMENTS

| | | | |
|---|---|---|---|
| 6,452,851 B1 * | 9/2002 | Endo et al. ................... | 365/205 |
| 6,646,954 B2 * | 11/2003 | Winograd et al. ...... | 365/233.14 |
| 6,937,535 B2 * | 8/2005 | Ahn et al. .................... | 365/222 |
| 7,200,061 B2 * | 4/2007 | Sekiguchi et al. ........... | 365/207 |
| 2002/0030214 A1 | 3/2002 | Horiguchi | |

FOREIGN PATENT DOCUMENTS

| | | |
|---|---|---|
| JP | 7321228 | 12/1995 |
| JP | 2002-94027 | 3/2002 |
| JP | 3745392 | 12/2005 |

\* cited by examiner

*Primary Examiner*—Anh Phung
(74) *Attorney, Agent, or Firm*—Young & Thompson

(57) ABSTRACT

A semiconductor memory device comprises: word lines; global bit lines intersecting therewith; local bit lines partitioned into N sections along the global bit lines and aligned with a same pitch as the global bit lines; N memory cell arrays each of which includes memory cells each having a vertical transistor structure connected to the local bit lines at a lower portion and each being formed at an intersection of the word line and the local bit line, and is arranged corresponding to each section of the local bit lines; local sense amplifiers for amplifying a signal read out from a selected memory cell to the local bit line and for outputting the signal to the global bit line; and global sense amplifiers for coupling the signal transmitted from the local sense amplifier corresponding to the selected memory cell through the global bit line to an external data line.

8 Claims, 11 Drawing Sheets

SEMICONDUCTOR MEMORY DEVICE

BACKGROUND OF THE INVENTION

1. Field of the Invention

The present invention relates to a semiconductor memory device which rewritably stores data in a plurality of memory cells formed at intersections of a plurality of word lines and a plurality of bit lines, and particularly relates to a semiconductor memory device employing an embedded bit line structure which is located below a vertical type transistor formed in each memory cell.

2. Description of the Related Art

Generally, a memory cell array of a DRAM includes a large number of memory cells formed at intersections of bit lines and word lines. In recent years, attention is paid to a technique using a vertical type transistor as a memory cell structure of the DRAM (e.g., see Patent References 1 and 2). In order to form a fine memory cell with a design rule such as 4F2, it is advantageous for integration and manufacturing to configure the memory cell array using vertical type transistors. On the premise of the structure of the vertical type transistor, it is general that a capacitor of each memory cell is formed over the vertical type transistor and that an embedded bit line structure in which a bit line is arranged below the vertical type transistor is employed.

Patent Reference 1: Laid-open Japanese Patent Publication No. 2002-94027

Patent Reference 2: Japanese Patent No 3745392

However, if the embedded bit line structure is employed, it is difficult to form a bit line arranged in a lower layer using metal or silicide having a low resistance. Therefore, the bit line needs to be formed using polysilicon or a diffusion layer, which inevitably causes the resistance thereof to increase, and it arises a problem of a decrease in operation speed of the DRAM. Meanwhile, the above Patent Reference 1 discloses a structure in which a lower source/drain electrode of the vertical type transistor is withdrawn upward via a contact and is connected to a bit line formed using a tungsten film. Thereby, a bit line resistance can be suppressed, but a complex structure is required for withdrawing the bit line upward, and it is undesirable in terms of an increase in the number of manufacturing steps and an increase in cost. Further, the above Patent Reference 2 discloses a structure in which a bit line is formed by doping n+ impurity into a polysilicon layer formed on a silicon oxide film. Thereby, a bit line capacitance can be reduced relative to a case of forming the bit line using an n+ impurity diffusion layer formed in a p type substrate. However, the bit line resistance becomes larger than that in a case of using the metal or silicide, and it is a problem that the operation speed further decreases. In this manner, when the memory cell array is configured by employing the vertical type transistor and the embedded bit line structure, it is difficult to prevent a decrease in the operation speed caused by an increase in the bit line resistance without deterioration of manufacturing and cost.

BRIEF SUMMARY OF THE INVENTION

An object of the present invention is to provide a semiconductor memory device in which a hierarchical memory cell array is configured, memory cells connected to a local bit line can be highly integrated so as to suppress an increase in chip area, and a decrease in operation speed caused by an increase in a bit line resistance can be effectively prevented when employing a vertical type transistor and an embedded bit line structure.

An aspect of the present invention is a semiconductor memory device comprising: a plurality of word lines; a plurality of global bit lines intersecting with said plurality of word lines; a plurality of local bit lines partitioned into N (N is an integer greater than or equal to two) sections along said global bit lines and aligned with a same pitch as said plurality of global bit lines; N memory cell arrays each of which includes a plurality of memory cells each having a vertical transistor structure connected to each of said local bit lines at a lower portion and each being formed at an intersection of the word line and the local bit line, and is arranged corresponding to each of the sections of said local bit lines; a plurality of local sense amplifiers for amplifying a signal read out from a selected memory cell to said local bit line and for outputting the signal to said global bit line; and a plurality of global sense amplifiers for coupling the signal transmitted from said local sense amplifier corresponding to the selected memory cell through said global bit line to an external data line.

According to the semiconductor memory device of the present invention, in a hierarchical memory cell array, the local bit lines partitioned into N sections along the global bit line are arranged, a signal read out from a memory cell formed at an intersection of a word line and a local bit line is amplified by the local sense amplifier through the local bit line, and the signal is further transmitted to the global bit line so as to be coupled to the external data line. Thus, even when low resistance material cannot be used for forming the local bit line due to structural restriction in order to connect the local bit line arranged below the memory cell using a vertical transistor structure, it is possible to suppress the overall bit line resistance by shortening the length of the local bit line. Thereby, a decrease in operation speed caused by an increase in the bit line resistance can be effectively prevented, and an increase in chip area can be suppressed by arranging memory cells with higher density.

In the present invention, each of said memory cells may comprise one MOS transistor and one capacitor, said MOS transistor may have one source/drain electrode connected to an accumulation electrode of said capacitor, an other source/drain electrode directly connected to said local bit line having an embedded structure at the lower portion, and a gate electrode connected to the word line and formed around a channel region between the two source/drain electrodes via a gate oxide film, and said capacitor may have an opposite electrode connected to an upper wiring layer, and is formed so that said opposite electrode and said accumulation electrode are arranged oppositely to each other via a dielectric film.

In the present invention, said local sense amplifiers may be single-ended sense amplifiers arranged so that a pitch thereof in a word line extending direction is twice the pitch of said local bit lines.

In the present invention, said local sense amplifier may include an amplifying MOS transistor for amplifying the signal read out to said local bit line and for outputting the signal to said global bit line and includes a precharging MOS transistor for precharging said local bit line.

In the present invention, said local sense amplifiers may be arranged on both sides of said memory cell array, and said local bit lines may be alternately connected to said local sense amplifiers on one side and the other side of said memory cell array. In this case, two adjacent said memory cell arrays may share said local sense amplifier.

In the present invention, said local sense amplifier may include a switching circuit for switching connections to said local bit lines of said two adjacent memory cell arrays. In this case, said switching circuit may include a MOS transistor having the vertical transistor structure, and said MOS transistor may connect between the local bit line at a lower portion and a local bit line inside a sense amplifier at an upper portion.

As described above, according to the present invention, by employing a hierarchical memory cell array, the entire semiconductor memory device is configured by arranging local bit lines partitioned into N sections along the global bit line, and the vertical transistor structure connected to a lower local bit line is employed in each memory cell to achieve a high-density memory cell array. Thereby, even if the local bit line cannot be formed using low resistance material due to a structural restriction, the bit line resistance can be reduced by shortening the length of the local bit line and a decrease in operation speed can be prevented when reading a signal. Further, memory cells having a small size as 4F2 can be achieved using the structure of memory cells and the simple single-ended local sense amplifiers, and thus an increase in the entire chip area can be suppressed.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

Preferred embodiments of the present invention will be described with reference to the accompanying drawings. In the following, two embodiments having different configurations will be described, in which the present invention is applied to a DRAM having a hierarchical memory cell array.

First Embodiment

Figure 1:
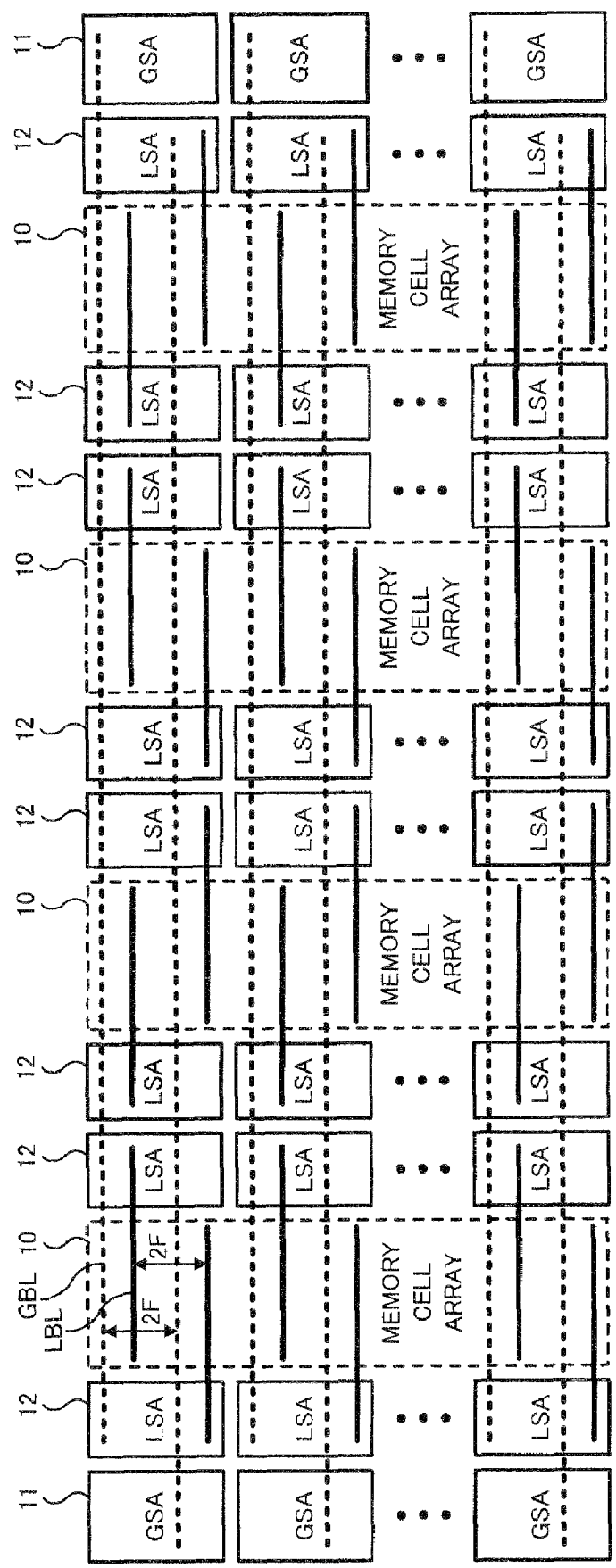
FIG. 1 is an entire configuration of a DRAM of a first embodiment.

A first embodiment of the present invention will be described first. FIG. 1 shows an entire configuration of the DRAM of the first embodiment. In FIG. 1, there are shown four memory cell arrays 10, a plurality of global sense amplifiers 11, a plurality of local sense amplifiers 12, a plurality of global bit lines GBL, and a plurality of local bit lines LBL.

Each memory cell array 10 includes a large number of memory cells formed at all intersections of a plurality of word lines and the plurality of local bit lines LBL intersecting therewith. As shown in FIG. 1, the plurality of local bit lines LBL is regularly aligned with a pitch 2F based on a design rule value F in a word line extending direction. Besides, the plurality of global bit lines GBL is also aligned with the same pitch 2F as the local bit lines LBL.

The local sense amplifiers 12 are arranged on both sides of the memory cell arrays 10, and each local sense amplifier 12 amplifies a signal read from a memory cell through a predetermined local bit line LBL. As shown in FIG. 1, one of two local bit lines LBL adjacent in the word line extending direction in the memory cell array 10 is connected to the left-side local sense amplifier 12, while the other thereof is connected to the right-side local sense amplifier 12. In this case, since the local bit line LBL are partitioned into sections corresponding to the arrangement of the memory cell arrays 10, each local sense amplifier 12 depends only on one memory cell array 10. Besides, the plurality of the local sense amplifiers 12 is aligned with a pitch 4F in the word line extending direction.

On the contrary, the global sense amplifiers 11 are arranged at both ends of the four memory cell arrays 10, and each global sense amplifier 11 further amplifies data transmitted from the local sense amplifier 12 to the global bit line GBL. As shown in FIG. 1, each global bit line GBL is arranged extending over all the four memory cell arrays 10. Thus, each global bit line GBL is connected to predetermined four local sense amplifiers 12 among eight local sense amplifiers 12 arranged in a line in a bit line extending direction. Further, one of two global bit lines GBL adjacent in the memory cell array 10 is connected to the left-side global sense amplifier 11, while the other thereof is connected to the right-side global sense amplifier 11. Besides, the plurality of global sense amplifiers 11 is also aligned with the pitch 4F in the word line extending direction.

When m local bit lines LBL are arranged in one memory cell array 10, m/2 local sense amplifiers 12 connected to m/2 local bit lines LBL are arranged on each of both sides of the memory cell array 10. In the entire four memory cell arrays 10, 4m local sense amplifiers 12 in total are arranged in eight rows, and m global sense amplifiers 11 in total are arranged in two rows (at both ends).

In this manner, since the memory cell array 10 is configured hierarchically, an increase in the number of memory cells connected to one local bit line LBL can be suppressed. When four of the above memory cell arrays 10 each including the above n word lines are arranged in parallel, data of 4n memory cells can be transmitted selectively through the global bit line GBL, but n memory cells connected to the local bit line LBL are only required. As the number of memory cells connected to the local bit line LBL is reduced, an overall bit line resistance can be suppressed even when the local bit line LBL is formed of material having a relatively large resistance value.

A configuration of the memory cell array 10 of FIG. 1 will be described with reference to FIG. 2. The memory cell array 10 shown in FIG. 2 includes a plurality of memory cells MC formed at all intersections of n word lines WL (WL1 to WLn) and m local bit lines LBL, and each memory cell MC is composed of an NMOS transistor N0 and a capacitor C0. Since m×n memory cells MC are arranged in one memory cell array 10, the memory cell array 10 becomes capable of storing m×n bit data in total.

One end (source) of the NMOS transistor N0 of each memory cell MC is connected to the local bit line LBL, and the other end (drain) thereof is connected to an accumulation electrode of the capacitor C0. A predetermined fixed potential is applied to an opposite electrode of the capacitor C0. This fixed potential is set to, for example, an intermediate voltage between a power supply voltage and a ground potential. Further, a word line WL is connected to a gate electrode of the NMOS transistor N0. When one word line WL selected in the memory cell array 10 is driven, m NMOS transistors N0 on the word line WL turn on and a minute signal based on accumulated charge of the capacitor C0 is read out to each local bit line LBL.

Figure 3:
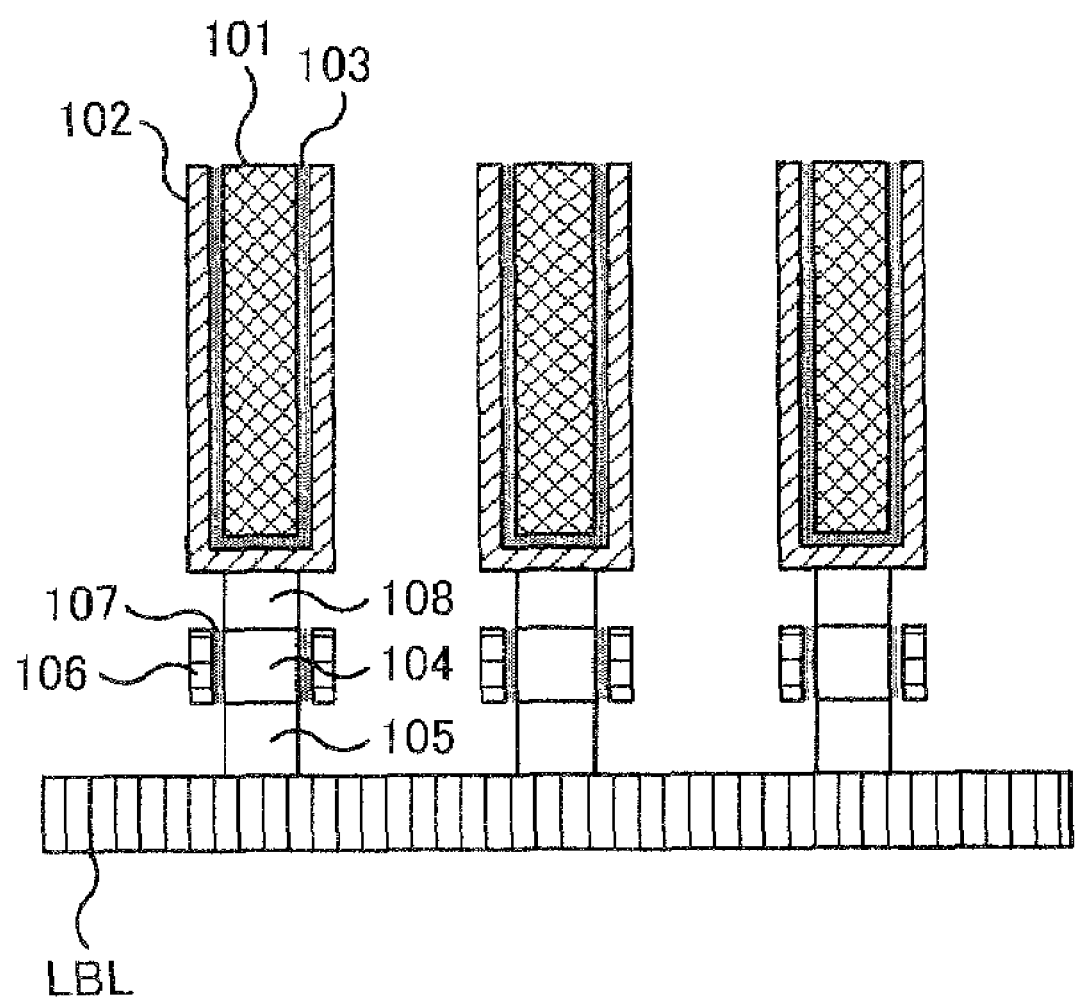
FIG. 3 is a diagram explaining a structure of a memory cell MC of FIG. 2.

In the first embodiment, it is assumed to employ a vertical type transistor N0 and an embedded bit line structure of the local bit line LBL in order to easily achieve high-density memory cells MC. In the following, a structure of the memory cell MC of the first embodiment will be described with reference to FIG. 3. FIG. 3 shows a schematic sectional structure of the memory cell MC in the memory cell array 10. The capacitor C0 of the memory cell MC is disposed at an upper portion, and has an inside opposite electrode 101 and an outside accumulation electrode 102, which are opposed to each other via a dielectric film 103. The opposite electrode 101 is connected to a wiring for supplying the predetermined fixed potential which is included in a wiring layer (not shown) arranged in an upper portion.

Meanwhile, at a lower portion of the capacitor C0, there are arranged a drain region 108, a channel region 104 and a source region 105 in the order from an upper side, and a gate electrode 106 is formed around the channel region 104 via a gate oxide film 107, respectively as a vertical transistor structure. The drain region 108 is connected to the accumulation electrode 102 of the capacitor C0 and the source region 105 is directly connected to the local bit line LBL of a lower layer. Further, the gate electrode 106 is directly connected to the word line WL. The local bit line LBL is formed using polysilicon or a diffusion layer and has a relatively high resistance.

The above structure of the memory cell MC is repeatedly arranged with a predetermined interval. In addition, an inter insulation film (not shown) is filled between adjacent memory cells MC. Since the interval of memory cells MC is constant, the length of the local bit line LBL is determined depending on the number of connected memory cells MC. Accordingly, an overall resistance value of the local bit line LBL changes approximately in proportion to the number of connected memory cells MC, and therefore it is desirable to reduce the number of memory cells MC as much as possible so as to decrease the resistance value.

Figure 4:
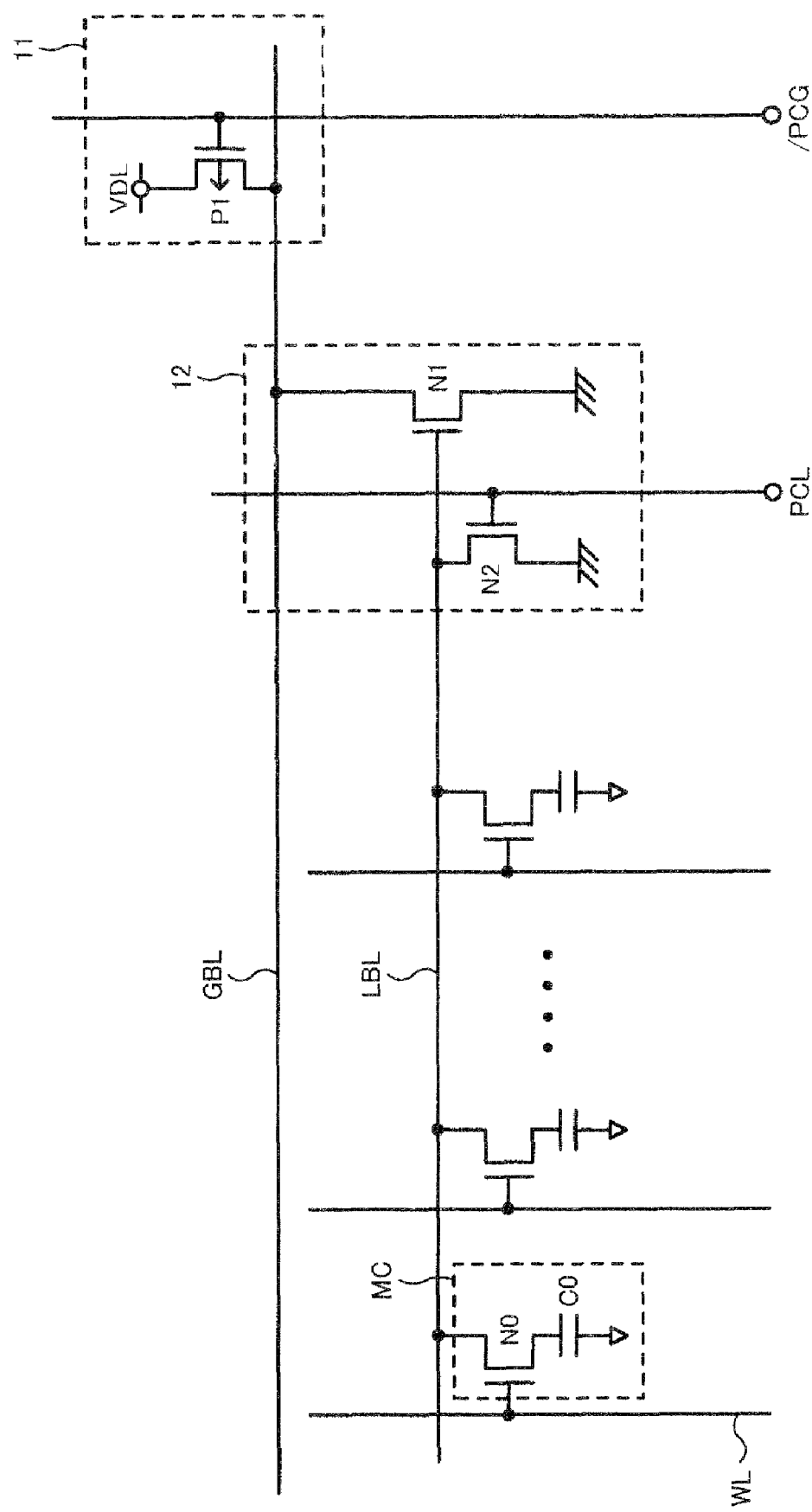
FIG. 4 is a diagram showing a configuration required in read operation in an area including a global bit line GBL, a local bit line LBL, a global sense amplifier 11 and a local sense amplifier 12, regarding a first specific example of the DRAM of the first embodiment.

Next, a first specific example of read operation in the DRAM of the first embodiment will be described with reference to FIGS. 4 and 5. FIG. 4 shows a configuration required in the read operation in the configuration of FIG. 1, corresponding to an area including one global bit line GBL, one local bit line LBL, one single-ended global sense amplifier 11 and one single-ended local sense amplifier 12.

The local sense amplifier 12 includes an amplifying NMOS transistor N1 and a precharging NMOS transistor N2. The amplifying NMOS transistor N1 is connected between the global bit line GBL and ground, and the gate thereof is connected to one end of the local bit line LBL. The plurality of memory cells MC each composed of the NMOS transistor N0 and the capacitor C0 is connected to the local bit line LBL, like in FIG. 2. The precharging NMOS transistor N2 is connected between the local bit line LBL and ground, and the gate thereof is connected to a precharge signal line PCL. Note that the local sense amplifier 12 actually includes a write circuit (not shown) required for write operation.

Meanwhile, the global sense amplifier 11 includes a precharging PMOS transistor P1. The precharging PMOS transistor P1 is connected between a power supply voltage VDL and the global bit line GBL, and the gate thereof is connected to a precharge signal line /PCG. The symbol / attached to each signal name means negative logic. Note that the global sense amplifier 11 actually includes an input/output circuit (not shown) connected to input/output lines.

In a precharge operation, the precharge signal line PCL of the local sense amplifier 12 is controlled to be high, and the precharge signal line /PCG of the global sense amplifier 11 is controlled to be low. Thus, the local bit line LBL is precharged to a ground potential VSS, and the global bit line GBL is precharged to the power supply voltage VDL. On the other hand, in the read operation for the memory cell MC, the precharge signal line PCL is controlled to be low and the precharge signal line /PCG is controlled to be high.

In this state, when the selected word line WL is driven, a signal read from an arbitrary memory cell MC is input to the gate of the amplifying NMOS transistor N1 through the local bit line LBL. When a high level is read out to the local bit line LBL, the global bit line GBL goes low, while when a low level is read out to the local bit line LBL, the global bit line GBL goes high, respectively by the operation of the amplifying NMOS transistor N1.

Figure 5:
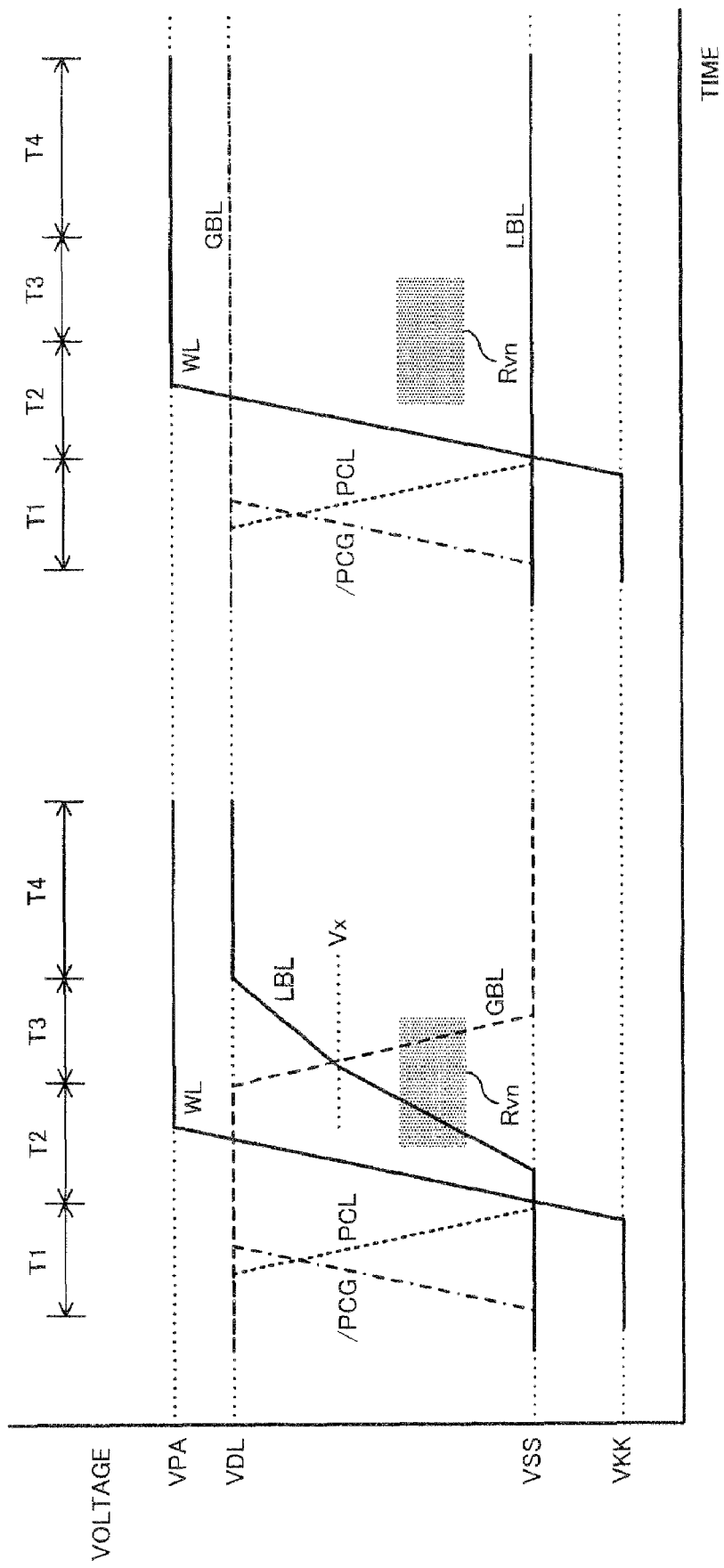
FIG. 5 is a diagram showing waveforms in a read operation where a high level is read first and subsequently a low level is read out in the circuit configuration of FIG. 4.

FIG. 5 shows waveforms in a read operation where a high level is read out from a selected memory cell MC first and subsequently a low level is read out from the selected memory cell MC in the configuration of FIG. 4. Four terms (T1 to T4) into which one read operation is divided are shown in the upper side of FIG. 5. Before a precharge cancel period T1 in the first half of FIG. 5, the precharge signal line PCL is controlled to be high and the precharge signal line /PCG is controlled to be low. Thus, the local bit line LBL is precharged to low and the global bit line GBL is precharged to high. Then, during the precharge cancel period T1, the precharge signal line PCL changes from high to low in order to cancel the precharge state of the local bit line LBL, and the precharge signal line /PCG changes from low to high in order to cancel the precharge state of the global bit line GBL.

During a cell selecting period T2, the word line WL selected corresponding to the target memory cell MC rises from a negative voltage VKK to a positive voltage VPA. The negative voltage VKK is set to a value lower than "low level" (ground potential VSS), and the positive voltage VPA is set to a value higher than "high level" (power supply voltage VDL). As a result, a signal of high level stored in a memory cell MC at an intersection of the word line WL and the local bit line LBL is read out and input to the local sense amplifier 12, thereby increasing the local bit line LBL to a voltage Vx. At this point, the voltage Vx of the local bit line LBL is set to a value higher than at least a threshold voltage range Rvn (represented by hatching in FIG. 5) of the amplifying NMOS transistor N1. The threshold voltage range Rvn is distributed within a predetermined voltage range depending on temperature or process fluctuation.

Subsequently, during a sensing period T3, the level of the global bit line GBL falls from high to low via the amplifying NMOS transistor N1 which has turned on. Meanwhile, the low level of the global bit line GBL is inverted by the write circuit (not shown) of the local sense amplifier 12 so as to increase the potential of the local bit line LBL, which gradually changes from the above voltage Vx to the level of the power supply voltage VDL. During a read period T4, in a state where the local bit line LBL remains high and the global bit line GBL remains low, the low level is read out to the input/output lines through the input/output circuit (not shown) of the global sense amplifier 11. Thereby, one read operation of the DRAM is completed.

Next, in the second half of FIG. 5, waveforms in the read operation are shown in the same manner, in which data of low level stored in the memory cell MC is read out. The waveforms during the precharge cancel period T1 is the same as in the first half of FIG. 5. Meanwhile, after the selected word line WL rises from the negative voltage VKK to the positive voltage VPA during the cell selecting period T2, the signal of low level stored in the memory cell MC is read out, and thus the local bit line LBL continues to remain low. During the sensing period T3, the global bit line GBL remains high by inverting the low level of the local bit line LBL. Thus, in a state where the local bit line LBL remains low and the global bit line GBL remains high during the read period T4, the high level is read out to the input/output lines in the above described manner.

Figure 6:
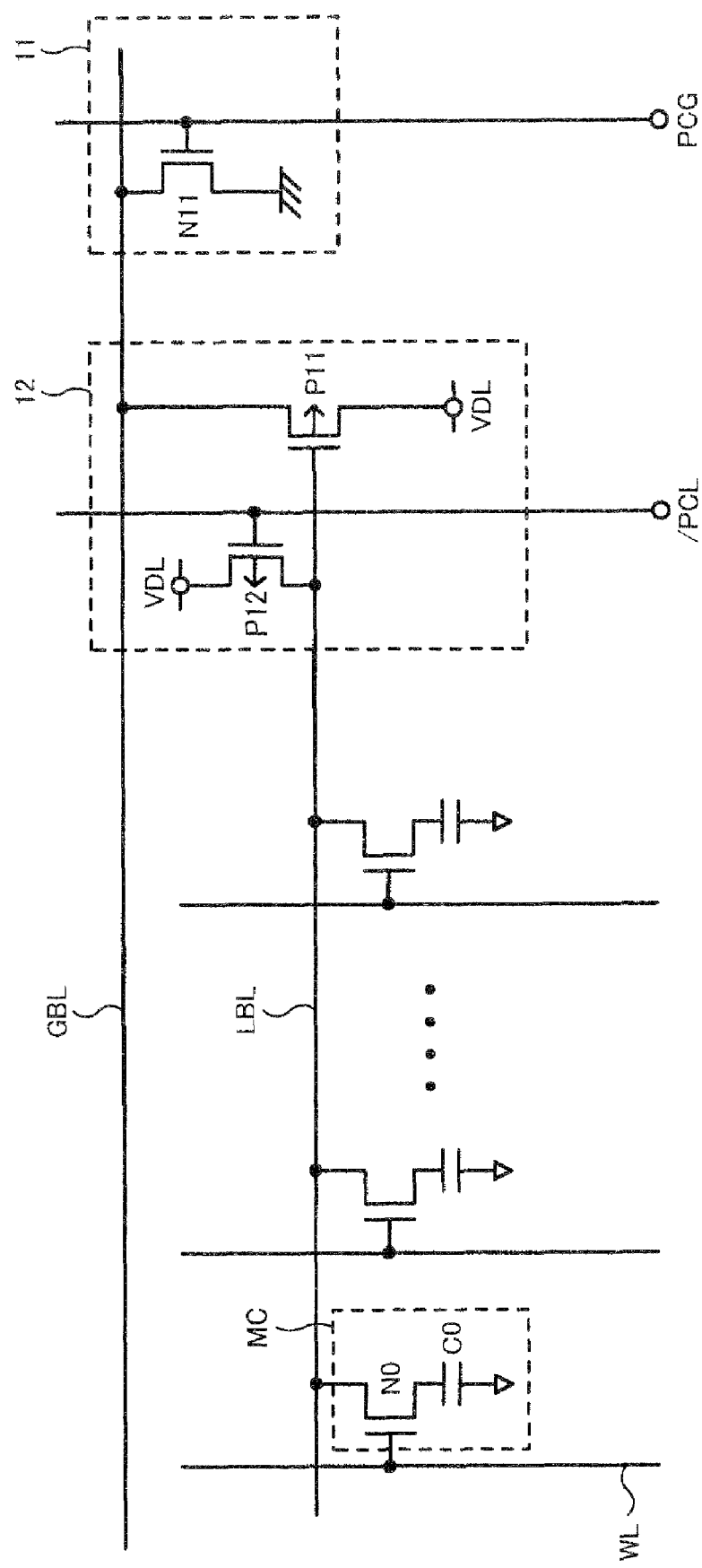
FIG. 6 is a diagram showing a configuration required in read operation in an area including a global bit line GBL, a local bit line LBL, a global sense amplifier 11 and a local sense amplifier 12, regarding a second specific example of the DRAM of the first embodiment.

Next, a second specific example of read operation in the DRAM of the first embodiment will be described with reference to FIGS. 6 and 7. FIG. 6 shows an example in which the configuration of the local sense amplifier 12 and the global sense amplifier 11 is modified in the same area as shown in FIG. 4. Besides, one local bit line LBL, the plurality of memory cells MC connected thereto, and one global bit line GBL are arranged in the same manner as FIG. 4.

The local sense amplifier 12 includes an amplifying PMOS transistor P11 and a precharging PMOS transistor P12. The amplifying PMOS transistor P11 is connected between the power supply voltage VDL and the global bit line GBL, and the gate thereof is connected to one end of the local bit line LBL. The precharging PMOS transistor P12 is connected between the power supply voltage VDL and the local bit line LBL, and the gate thereof is connected to a precharge signal line/PCL. In this manner, the local sense amplifier 12 of FIG. 6 is configured by replacing the two NMOS transistors N1 and N2 of the local sense amplifier 12 of FIG. 4 with the two PMOS transistors P11 and P12.

Meanwhile, the global sense amplifier 11 includes a precharging NMOS transistor N11. The precharging NMOS transistor N11 is connected between the global bit line GBL and ground, and the gate thereof is connected to a precharge signal line PCG. In this manner, the global sense amplifier 11 of FIG. 6 is configured by replacing the precharging PMOS transistor P1 of FIG. 4 with the precharging NMOS transistor N11.

In the precharge operation, the precharge signal line/PCL of the local sense amplifier 12 is controlled to be low, and the precharge signal line PCG of the global sense amplifier 11 is controlled to be high. Thus, the local bit line LBL is precharged to the power supply voltage VDL, and the global bit line GBL is precharged to the ground potential VSS. On the other hand, in the read operation for the memory cell MC, the precharge signal line/PCL is controlled to be high and the precharge signal line PCG is controlled to be low.

In this state, when the selected word line WL is driven, a signal read from an arbitrary memory cell MC is input to the gate of the amplifying PMOS transistor P11 through the local bit line LBL. When a high level is read out to the local bit line LBL, the global bit line GBL goes low, while when a low level is read out to the local bit line LBL, the global bit line GBL goes high, respectively by the operation of the amplifying PMOS transistor P11.

Figure 7:
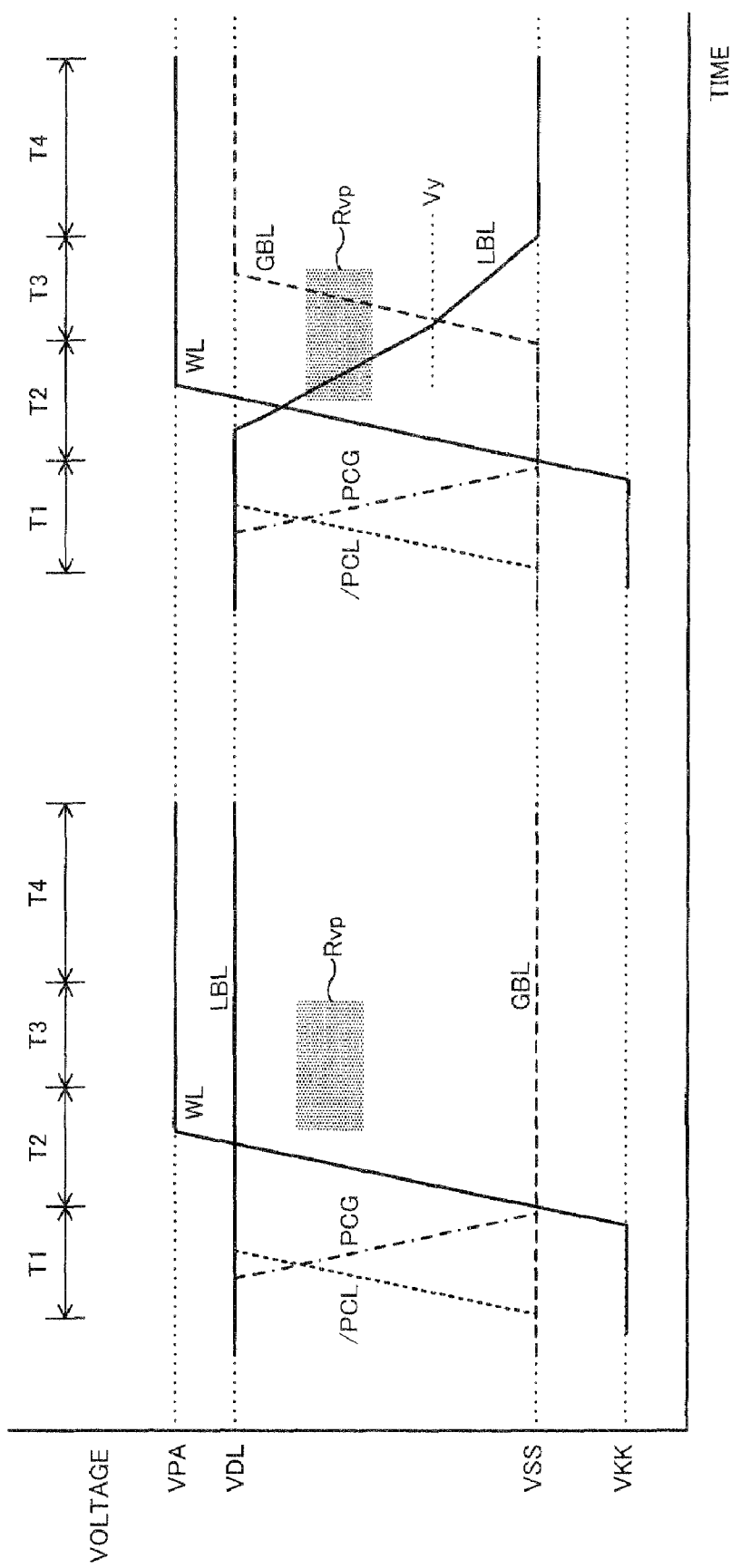
FIG. 7 is a diagram showing waveforms in a read operation where a high level is read first and subsequently a low level is read out in the circuit configuration of FIG. 6.

FIG. 7 shows waveforms in a read operation where a high level is read out from a selected memory cell MC first and subsequently a low level is read out from the selected memory cell MC in the configuration of FIG. 6. The four terms (T1 to T4) shown in the upper side of FIG. 7 have the same meanings as FIG. 5. Most of the waveforms are common to those in FIG. 5, and thus only different points will be mainly described below. Before the precharge cancel period T1 in the first half of FIG. 7, the precharge signal line/PCL is controlled to be low and the precharge signal line PCG is controlled to be high. Thus, the local bit line LBL is precharged to high and the global bit line GBL is precharged to low. In this manner, polarities in FIG. 7 are opposite to those in FIG. 5. Therefore, when canceling the respective precharge states during the precharge cancel period T1, the precharge signal line/PCL changes from low to high and the precharge signal line PCG changes from high to low.

During the cell selecting period T2, the word line WL changes in the same manner as in FIG. 5. As a result, a signal of high level stored in the memory cell MC is read out, and thus the local bit line LBL continues to remain high. Note that a threshold voltage range Rvp (represented by hatching in FIG. 7) of the amplifying PMOS transistor P11 is distributed within a voltage range higher than that of the threshold voltage range Rvn of FIG. 5. Meanwhile, the global bit line GBL remains low by inverting the high level of the local bit line LBL during the sensing period T3. Thus, in a state where the local bit line LBL remains high and the global bit line GBL remains low during the read period T4, the low level is read out to the input/output lines via the above input/output circuit (not shown).

Next, in the second half of FIG. 7, waveforms in the read operation are shown in the same manner, in which data of low level in the memory cell MC is read out. The waveforms during the precharge cancel period T1 is the same as in the first half of FIG. 7. Meanwhile, after the selected word line WL rises from the negative voltage VKK to the positive voltage VPA during the cell selecting period T2, the signal of low level stored in the memory cell MC is read out and input to the local sense amplifier 12, thereby decreasing the local bit line LBL to a voltage Vy from the power supply voltage VDL. At this point, the voltage Vy of the local bit line LBL is set to a value lower than at least the above threshold voltage range Rvp of the amplifying PMOS transistor P11.

Subsequently, the global bit line GBL rises from low to high via the amplifying PMOS transistor P11 which has turned on during the sensing period T3. Meanwhile, the high level of the global bit line GBL is inverted by the write circuit (not shown) of the local sense amplifier 12 so as to decrease the potential of the local bit line LBL, which gradually changes from the above voltage Vy to the ground potential VSS. During the read period T4, in a state where the local bit line LBL remains low and the global bit line GBL remains high, the high level is read out to the input/output lines via the above input/output circuit (not shown).

By employing the configuration of the first embodiment, it is possible to prevent a decrease in operation speed caused by an increase in the bit line resistance when a signal read from the memory cell MC is transmitted through the local bit lines LBL. Generally, the polysilicon or the diffusion layer used in the embedded bit line structure has a larger resistance than that of metal or silicide, however the first embodiment requires a small number of memory cells MC connected to the local bit line LBL, and correspondingly the bit line resistance can be suppressed. Further, since the vertical transistor structure is employed for each memory cell MC, it is suitable for arranging the memory cells MC with higher density. Furthermore, since the single-ended local sense amplifier 12 is employed, the circuit scale can be small so that an increase in the entire chip area can be prevented.

Second Embodiment

Figure 8:
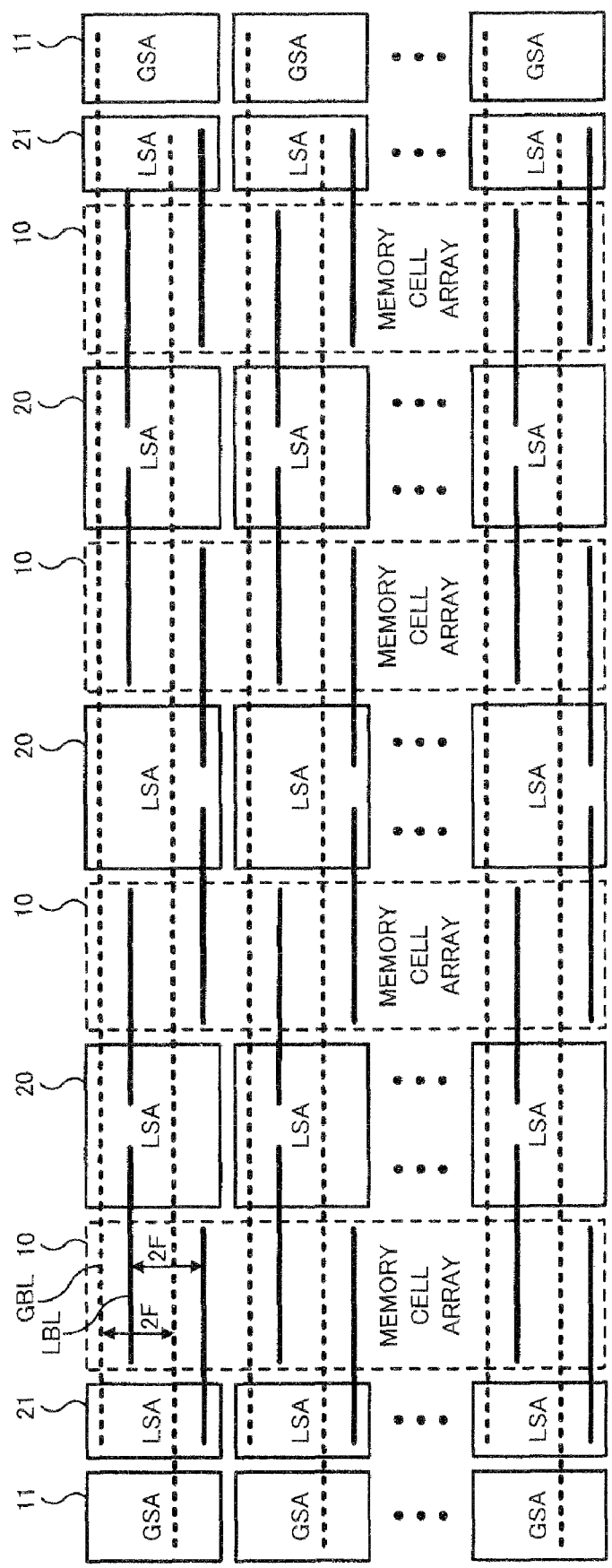
FIG. 8 is an entire configuration of a DRAM of a second embodiment.

A second embodiment of the present invention will be described. The DRAM of the second embodiment differs from the entire configuration of DRAM of the first embodiment in that adjacent memory cell arrays 10 share a local sense amplifier 20. FIG. 8 shows an entire configuration of the DRAM of the second embodiment. In FIG. 8, there are shown four memory cell arrays 10, a plurality of global sense amplifiers 11, a plurality of shared local sense amplifiers 20, a plurality of non-shared local sense amplifiers 21, a plurality of global bit lines GBL, and a plurality of local bit lines LBL.

In FIG. 8, configurations of the four memory cell arrays 10 and the plurality of global sense amplifiers 11 are common to those of FIG. 1. Meanwhile, in an area including two adjacent global bit lines GBL, three shared local sense amplifiers 20 are arranged between memory cell arrays 10, and two non-shared local sense amplifiers 21 are arranged at both ends of the four memory cell arrays 10. Two local bit lines LBL included in memory cell arrays 10 on both sides are connected to each local sense amplifier 20, and a signal read out from selected one local bit line LBL is amplified by the local sense amplifier 20.

Figure 9:
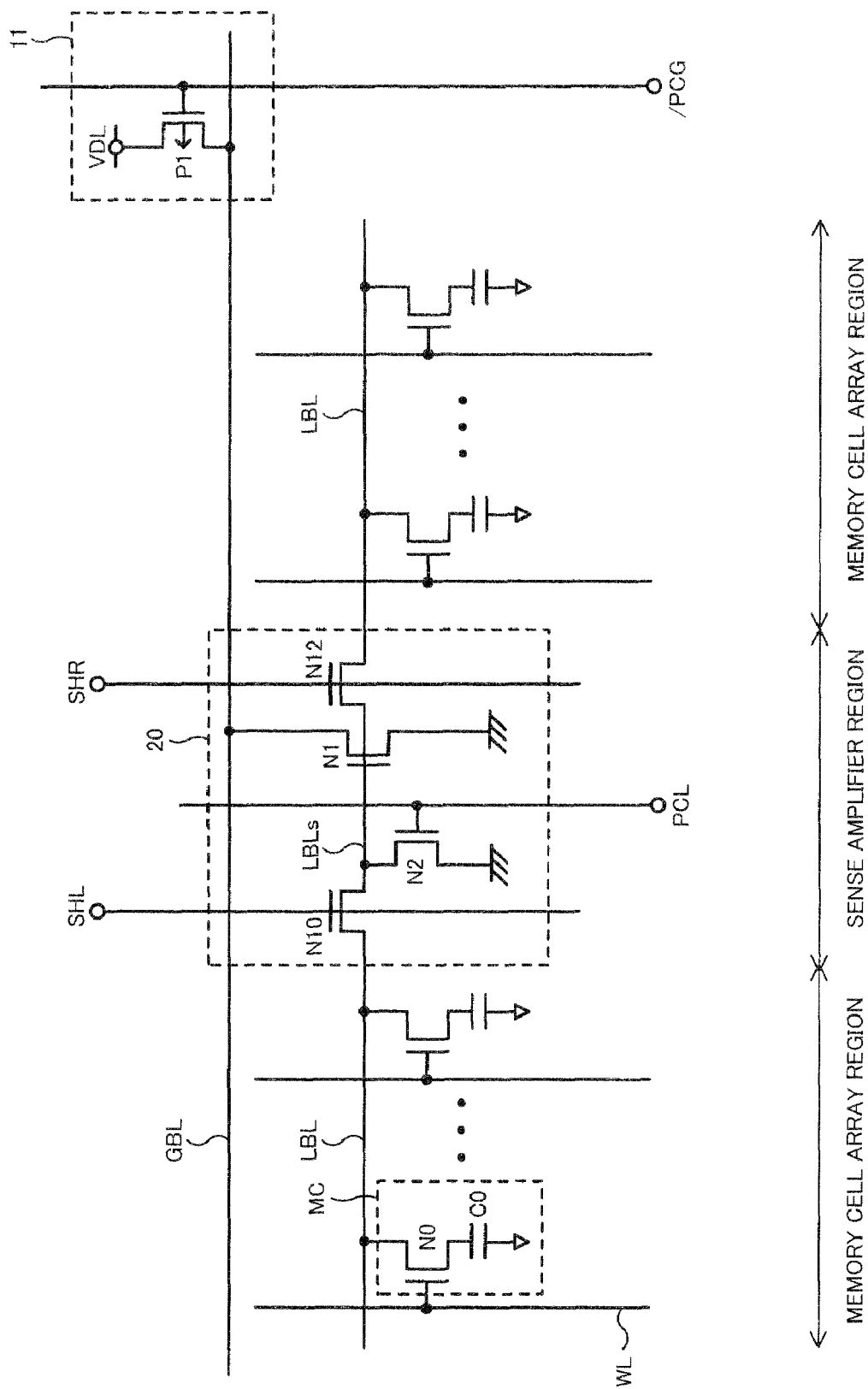
FIG. 9 is a diagram showing a configuration required in read operation in an area including a global bit line GBL, a global sense amplifier 11, a shared local sense amplifier 20, and two local bit lines LBL regarding a specific example of the DRAM of the second embodiment.

Next, a specific example of read operation in the DRAM of the second embodiment will be described with reference to FIGS. 9 and 10. FIG. 9 shows a configuration required in the read operation in the configuration of FIG. 8, corresponding to an area including one global bit line GBL, one single-ended global sense amplifier 11, one single-ended shared local sense amplifier 20, and two local bit lines LBL on both sides of the local sense amplifier 20.

Figure 2:
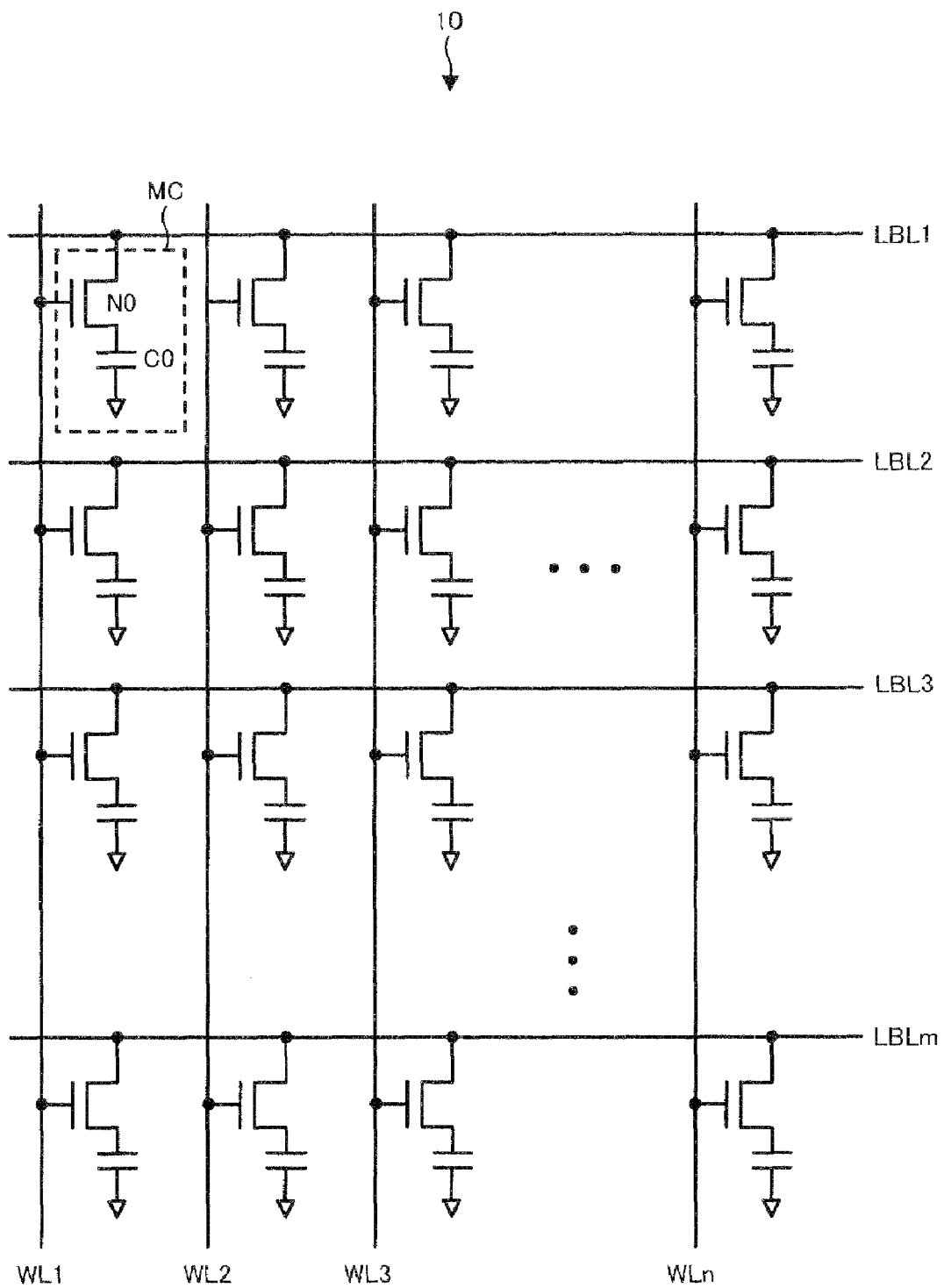
FIG. 2 is a diagram showing a configuration of a memory cell array of FIG. 1.

The local sense amplifier 20 includes NMOS transistors N10 and N12 as switching circuits, in addition to an amplifying NMOS transistor N1 and a precharging NMOS transistor N2 which are the same as in FIG. 2. The NMOS transistor N10 is connected between one local bit line LBL and the gate of the amplifying NMOS transistor N1, and has a gate connected to a switching signal line SHL. The NMOS transistor N12 is connected between the other local bit line LBL and the gate of the amplifying NMOS transistor N1, and has a gate connected to a switching signal line SHR.

In the local sense amplifier 20, an area of the local bit line LBL, which is sandwiched between the two NMOS transistors N10 and N12, is represented by a local bit line LBLs inside a sense amplifier. This local bit line LBLs inside a sense amplifier has a different structure from that of the two local bit lines LBL on the both sides, which will be described later in detail. By the configuration of FIG. 9, the local bit line LBLs inside a sense amplifier can be selectively connected to either of the local bit lines LBL via one of the NMOS transistors N10 and N12 on the both sides, which is controlled to be in an ON state. In read and write operations, one of the switching signal lines SHR and SHL is controlled to be high and the other thereof is controlled to be low, corresponding to a selected memory cell array 10.

In addition, since the plurality of local bit lines LBL is alternately connected to the left side and the right side local sense amplifiers 20, the switching signal lines SHR and SHL are independently controlled for different local sense amplifiers 20. Further, each of the two local sense amplifiers 21 at both ends in FIG. 8 is configured to include either of the two NMOS transistors N10 and N12 in the configuration of FIG. 9. That is, one local sense amplifier 21 includes the NMOS transistor N10 whose gate is connected to the switching signal line SHL, and the other local sense amplifier 21 includes the NMOS transistor N12 whose gate is connected to the switching signal line SHR.

Figure 10:
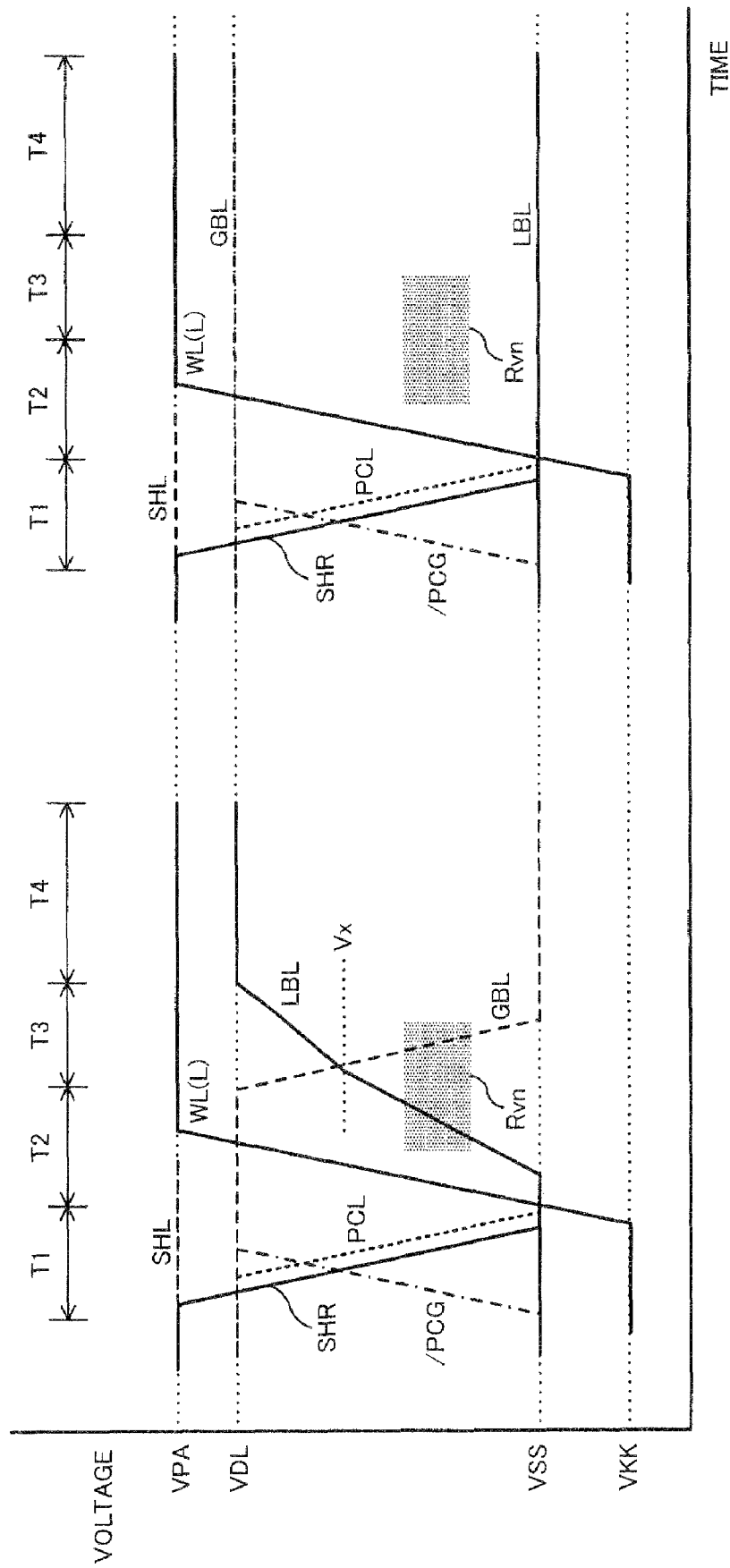
FIG. 10 is a diagram showing waveforms in a read operation where a high level is read first and subsequently a low level is read out in the circuit configuration of FIG. 9.

FIG. 10 shows waveforms in a read operation where a high level is read out from a selected memory cell MC first and subsequently a low level is read out from the selected memory cell MC in the configuration of FIG. 9. Note that a case where the left side memory cell array 10 is selected is assumed. Four terms (T1 to T4) in the upper side of FIG. 10 have the same meanings as in FIG. 5. Most of the waveforms in FIG. 10 are common to those in FIG. 5, and thus only different points will be mainly described below. During the precharge cancel period T1 in the first half of FIG. 10, one switching signal line SHR changes from high to low and the other switching signal line SHL remains in a high state. Note that the switching signal lines SHL and SHR are controlled to be the positive voltage VPA and the ground potential VSS.

Thereby, the local sense amplifier 20 on the right side of the selected memory cell array 10 becomes in a state where the left side transistor N10 is ON and the right side transistor N12 is OFF. Thus, thereafter, the amplifying NMOS transistor N1 is connected to the left side local bit line LBL through the local bit line LBLs inside a sense amplifier. Also during the precharge cancel period T1 in the second half of FIG. 10, the waveforms changes in the same manner as in the first half. Besides, when the right side memory cell array 10 of FIG. 9 is selected, the waveforms of the switching signal lines SHL and SHR are replaced with each other in FIG. 10.

Figure 11:
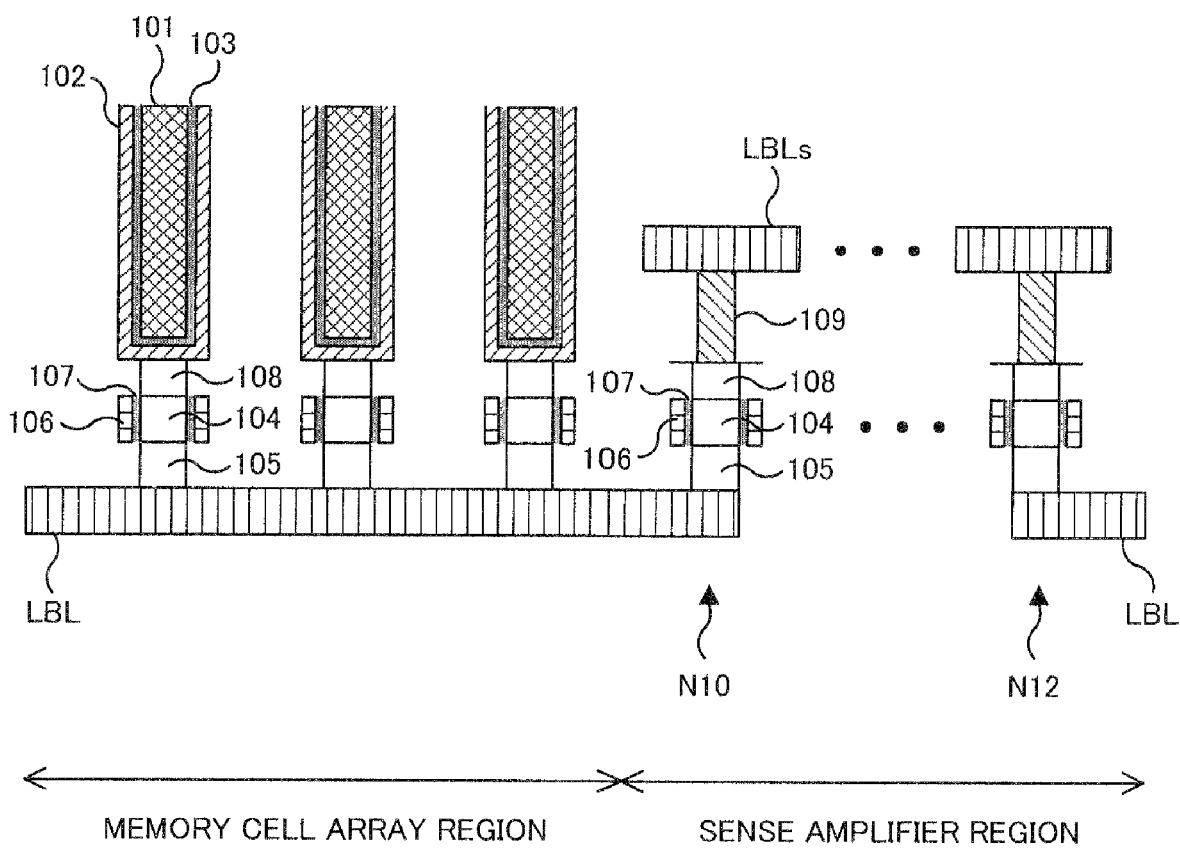
FIG. 11 is a diagram explaining a structure of a memory cell MC of the second embodiment and its periphery.

In the following, a structure of the memory cell MC of the second embodiment and its periphery will be described with reference to FIG. 11. FIG. 11 shows a sectional structure of an area including a memory cell array region and a sense amplifier region which are shown in FIG. 9. Among these, the sectional structure of the memory cell MC in the memory cell array region is the same as in FIG. 3, so description thereof is omitted. Meanwhile, the NMOS transistor N10 of the local sense amplifier 12 is formed in a vicinity of a boundary between the memory cell array region and the sense amplifier region. This NMOS transistor N10 has the vertical transistor structure in the same manner as the NMOS transistor N0 of the memory cell MC.

Thus, there are arranged a source region 105 directly connected to the lower local bit line LBL, a channel region 104 around which a gate electrode 106 is formed via a gate oxide film 107, and a drain region 108, in the order from a lower layer. The drain region 108 is connected to one end of the local bit line LBLs inside a sense amplifier arranged in an upper portion via a contact 109. At the other end of the local bit line LBLs inside a sense amplifier, there are formed the NMOS transistor N12 having the same transistor structure, and the source region 105 thereof is directly connected to the other local bit line LBL. Note that other MOS transistors in the sense amplifier region are formed with a normal plane structure.

In the second embodiment, the NMOS transistors N10 and N12 as switching circuits of the local sense amplifier 20 can be formed with the vertical transistor structure in the same manner as the NMOS transistor N0 of the memory cell MC. In this case, a signal path of the local bit line LBL is lifted from a lower layer to an upper layer and connected to the local bit line LBLs inside a sense amplifier, by the vertical transistor structure of the NMOS transistors N10 and N12 and the contact 109. Thus, the vertical transistor structure can be employed for the two NMOS transistors N10 and N12 in the local sense amplifier 20, thereby reducing a corresponding area. As described above, in consideration of the effect that the number of the shared local sense amplifiers 20 can be small, the entire area of the semiconductor memory device can be sufficiently reduced. In addition, the effect of the second embodiment to prevent a reduction in the operation speed caused by an increase in the bit line resistance of each local bit line LBL is the same as the first embodiment.

As described above, the present invention has been specifically described based on the two embodiments. However, the present invention is not limited to the above described embodiments, and can be variously modified without departing the essentials of the present invention. For example, an example has been shown in which the local bit lines LBL are partitioned into four sections in the bit line extending direction in the hierarchical memory cell array 10, however the number of sections is not limited to four and can be set freely. In this case, if N (N is an integer greater than or equal to two) local bit lines LBL partitioned along one global bit line GBL are arranged and the number N is set to a larger number, the number of memory cells MC connected to one local bit line LBL can be reduced. Particularly, if the number of memory cells MC in total becomes large in a large capacity DRAM, it is desirable to reduce the number of memory cells MC by partitioning the local bit lines LBL into small sections as much as possible so as to reduce the bit line resistance.

The present invention is not limited to the above described embodiments, and various variations and modifications may be possible without departing from the scope of the present invention.

This application is based on the Japanese Patent application No. 2007-139735 filed on May 25, 2007, entire content of which is expressly incorporated by reference herein.

What is claimed is:

1. A semiconductor memory device comprising:
   a plurality of word lines;
   a plurality of global bit lines intersecting with said plurality of word lines;
   a plurality of local bit lines partitioned into N (N is an integer greater than or equal to two) sections along said global bit lines and aligned with a same pitch as said plurality of global bit lines;
   N memory cell arrays each of which includes a plurality of memory cells each having a vertical transistor structure connected to each of said local bit lines at a lower portion and each being formed at an intersection of the word line and the local bit line, and is arranged corresponding to each of the sections of said local bit lines;
   a plurality of local sense amplifiers for amplifying a signal read out from a selected memory cell to said local bit line and for outputting the signal to said global bit line; and
   a plurality of global sense amplifiers for coupling the signal transmitted from said local sense amplifier corresponding to the selected memory cell through said global bit line to an external data line.

2. The semiconductor memory device according to claim 1, wherein each of said memory cells comprises one MOS transistor and one capacitor,
   said MOS transistor has one source/drain electrode connected to an accumulation electrode of said capacitor, an other source/drain electrode directly connected to said local bit line having an embedded structure at the lower portion, and a gate electrode connected to the word line and formed around a channel region between the two source/drain electrodes via a gate oxide film,
   and said capacitor has an opposite electrode connected to an upper wiring layer, and is formed so that said opposite electrode and said accumulation electrode are arranged oppositely to each other via a dielectric film.

3. The semiconductor memory device according to claim 1, wherein said local sense amplifiers are single-ended sense amplifiers arranged so that a pitch thereof in a word line extending direction is twice the pitch of said local bit lines.

4. The semiconductor memory device according to claim 3, wherein said local sense amplifier includes an amplifying MOS transistor for amplifying the signal read out to said local bit line and for outputting the signal to said global bit line and includes a precharging MOS transistor for precharging said local bit line.

5. The semiconductor memory device according to claim 4, wherein said local sense amplifiers are arranged on both sides of said memory cell array, and said local bit lines are alternately connected to said local sense amplifiers on one side and the other side of said memory cell array.

6. The semiconductor memory device according to claim 5, wherein two adjacent said memory cell arrays share said local sense amplifier.

7. The semiconductor memory device according to claim 6, wherein said local sense amplifier includes a switching circuit for switching connections to said local bit lines of said two adjacent memory cell arrays.

8. The semiconductor memory device according to claim 7, wherein said switching circuit includes a MOS transistor having the vertical transistor structure, and said MOS transistor connects between the local bit line at a lower portion and a local bit line inside a sense amplifier at an upper portion.

* * * * *